United States Patent [19]

Spencer et al.

[11] Patent Number: 4,673,456

[45] Date of Patent: Jun. 16, 1987

[54] MICROWAVE APPARATUS FOR GENERATING PLASMA AFTERGLOWS

[75] Inventors: John E. Spencer, Plano; Richard A. Borel, Garland; Kenneth E. Linxwiler, McKinney, all of Tex.; Andrew M. Hoff, State College, Pa.

[73] Assignee: Machine Technology, Inc., Parsippany, N.J.

[21] Appl. No.: 777,032

[22] Filed: Sep. 17, 1985

[51] Int. Cl.[4] ...................... H01L 21/306; B44C 1/22
[52] U.S. Cl. .................................... 156/345; 156/643; 156/646; 204/298
[58] Field of Search ........................... 204/192 E, 298; 156/643, 646, 653, 657, 659.1, 662, 668; 427/38, 39; 118/728, 50.1, 620

[56] References Cited

U.S. PATENT DOCUMENTS

| | | |
|---|---|---|
| 4,065,369 | 12/1977 | Ogawa et al. |
| 4,094,722 | 6/1978 | Yamamoto et al. |
| 4,115,184 | 9/1978 | Poulsen |
| 4,138,306 | 2/1979 | Niwa |
| 4,160,690 | 7/1979 | Shibagaki et al. |
| 4,175,235 | 11/1979 | Niwa et al. |
| 4,192,706 | 3/1980 | Horiike ........................ 156/646 X |
| 4,230,515 | 10/1980 | Zajac |
| 4,253,907 | 3/1981 | Parry et al. |
| 4,282,267 | 8/1981 | Kuyel |
| 4,316,791 | 2/1982 | Taillet ........................ 156/345 X |
| 4,328,068 | 5/1982 | Curtis |
| 4,340,462 | 7/1982 | Koch ........................ 156/345 X |
| 4,342,901 | 8/1982 | Zajac |
| 4,348,577 | 9/1982 | Toyoda et al. |
| 4,368,092 | 1/1983 | Steingerg et al. |
| 4,392,932 | 7/1983 | Harra |
| 4,431,898 | 2/1984 | Reinberg et al. |
| 4,438,315 | 3/1984 | Toyada et al. |
| 4,473,437 | 9/1984 | Higashikawa et al. ........ 156/345 X |
| 4,507,588 | 3/1985 | Asmussen et al. |
| 4,512,283 | 4/1985 | Bonifield |
| 4,512,868 | 4/1985 | Fujimura et al. |
| 4,581,100 | 4/1986 | Hatzakis et al. ............... 156/646 X |

OTHER PUBLICATIONS

Radio–Frequency Biased Microwave Plasma Etching Technique: A Method to Increase $SiO_2$ Etch Rate article by K. Suzuki, et al.
High–Temperature Kinetics of Pyrolytic Graphite Gasification by Fluorine Atoms and Molecules article by D. Rosner, et al.
Microwave Discharge Atom Source for Chemical Lasers* article by R. McFarlane.
A Waveguide–Based Launcher to Sustain Long Plasma Columns Through the Propagation of an Electromatic Surface Wave article by M. Moisan, et al.
Application of EPR Spectroscopy to Oxidative Removal of Organic Materials article by J. Cook, et al.
Plasma Chemistry Electrical Discharges by F. K. McTaggart 32, 301 (1960) Chapter 7.
Article Entitled "Chemical Instrumentation" by S. Z. Lewin, Journal of Chemical Education.
Article Entitled "Kinetics of the Attack of Molybdenum by Dissociated Chlorine", by David E. Rosner and H. Donald Allendorf, The Journal of Physical Chemistry.

Primary Examiner—William A. Powell
Attorney, Agent, or Firm—Lerner, David, Littenberg, Krumholz & Mentlik

[57] ABSTRACT

A microwave apparatus for generating plasma afterglows for stripping and/or etching of photoresist and semiconductor material at a sufficiently high rate to allow single wafer processing in a fully automated reactor. The apparatus includes a stripping/etching chamber for plasma afterglow stripping of photoresist and selective isotropic etching of semiconductor material, such as polysilicon and silicon nitride, using a variety of etchant compositions which form reactive species in a plasma. In addition, the apparatus may be employed for anisotropic etching for semiconductive material by decoupling etchant generation from ion production and acceleration by using two plasma sources, i.e., microwave power and radio frequency (RF) power. Anisotropic etching is carried out in an etching chamber which subjects, in situ, a plasma afterglow to RF power and which is designed to operate in the reactive ion etch mode.

28 Claims, 15 Drawing Figures

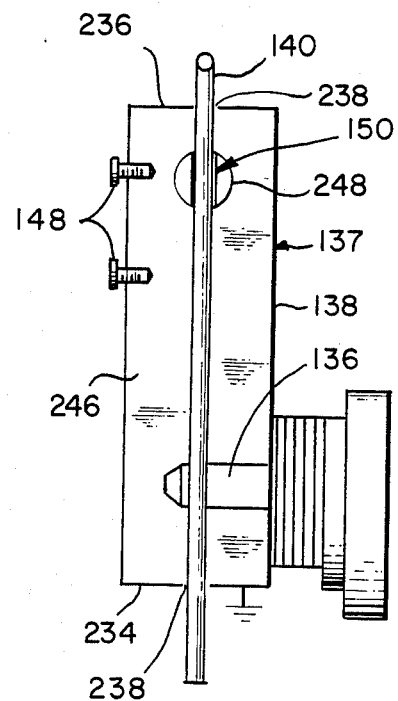
FIG. 8
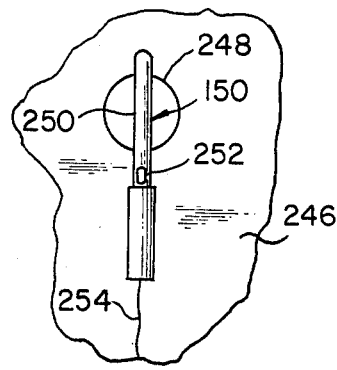
FIG. 9
FIG. 10
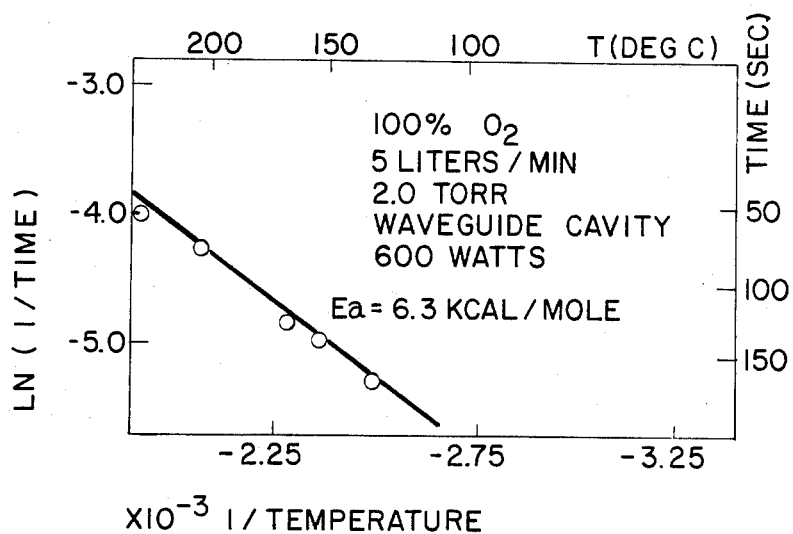

glows which have a sufficiently high etching rate to allow single semiconductor wafer processing in a fully automated reactor.

Another object of the present invention is to provide a microwave apparatus for generating plasma afterglows which is designed for high uniformity, the stripping and/or etching of each semiconductor wafer being monitored individually, thus insuring complete processing of each wafer with a minimum of over-etch time.

Another object of the present invention is to provide a microwave apparatus for generating plasma afterglows which avoids subjecting the wafer to high DC potentials which can cause radiation damage to the wafer and a resulting yield loss.

Another object of the present invention is to provide a microwave apparatus for generating plasma afterglows which prevents catalyic recombination of the reactive species at the walls of the apparatus.

Another object of the present invention is to provide a microwave apparatus for generating plasma afterglows which decouples etchant generation from ion production and acceleration by using two plasma sources, i.e., microwave power and RF power.

Another object of the present invention is to provide a microwave apparatus for generating plasma afterglows which is designed to operate in the reactive ion etch (RIE) mode.

Another object of the present invention is to provide a microwave apparatus for generating plasma afterglows which is adaptable for etching at high rates to achieve high through-puts at various process conditions.

In accordance with one embodiment of the present invention, there is described an apparatus for treating a workpiece by a plasma formed from a gas, the apparatus comprising plasma forming means for forming a plasma from a gas, a process chamber arranged apart from the plasma forming means for receiving a workpiece, the process chamber connected to the plasma forming means for receiving the plasma, and energy applying means for applying energy to the plasma within the process chamber to achieve treating of the workpiece.

In accordance with another embodiment of the present invention, there is described an apparatus for treating a workpiece by a plasma formed from a gas, the apparatus comprising a resonant cavity positioned within the apparatus, transporting means extending through the resonant cavity for transporting a gas therethrough from a source thereof, the transporting means arranged to permit the movement thereof relative to the resonant cavity, a source of energy connected to the resonant cavity for generating a plasma from the gas within the transporting means, a process chamber having a portion movable between an open position and a closed position for receiving a workpiece within the process chamber, the transporting means connected to the portion for transporting the plasma to the process chamber for treating the workpiece, whereby the relative movement between the transporting means and the resonant cavity permits the resonant cavity and the source of energy to remain stationary during the opening and closing of the process chamber.

In accordance with another embodiment of the present invention, there is described a method for stripping or etching photoresist material provided on a workpiece positioned within a process chamber. The method comprises the steps of creating a plasma by the excitation of a mixture comprising $O_2$ and $N_2O$, and exposing the photoresist material to the plasma within the process chamber.

In accordance with another embodiment of the present invention, there is described a method for treating a workpiece by a plasma formed from a gas, the method comprising the steps of forming a plasma from a gas in a reactor, supplying the plasma to a process chamber containing a workpiece and arranged apart from the reactor, and applying energy to the plasma within the process chamber to achieve treating of the workpiece.

BRIEF DESCRIPTION OF THE DRAWINGS

The above description, as well as other objects, features and advantages of the present invention, will be more fully understood by reference to the following detailed description of the presently preferred, but nonetheless illustrative, microwave apparatus for generating plasma afterglows in accordance with the present invention, when taken in conjunction with the accompanying drawings, wherein:

FIG. 8 is a side elevational view of the microwave reactor as shown in FIG. 1, having a side portion thereof removed, and illustrating the arrangement of the microwave plasma tube in relationship to a magnetron and mercury/argon plasma ignitor;

FIG. 9 is a front elevational view of the mercury/argon lamp plasma ignitor, as partially shown in FIG. 8;

FIG. 10 is a graph illustrating the dependence of the etch rate for stripping photoresist material as a function of wafer temperature and etching time using pure oxygen as a reactive specie;

MICROWAVE APPARATUS FOR GENERATING PLASMA AFTERGLOWS

BACKGROUND OF THE INVENTION

Figure 1:
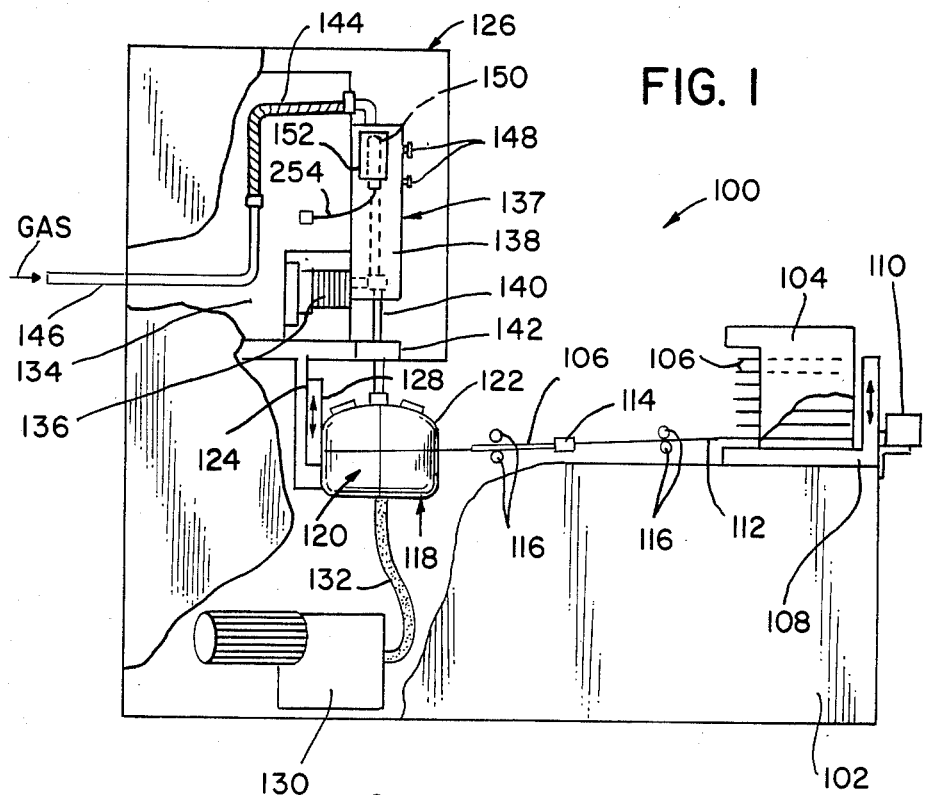
FIG. 1 is a front elevational view of a microwave apparatus for generating plasma afterglows in accordance with the present invention, illustrating its construction to include a semiconductor wafer transporting assembly, a microwave reactor and a stripping/etching chamber.

The present invention relates in general to a microwave apparatus for generating plasma afterglows, and more particularly, to such an apparatus including a chamber for plasma afterglow stripping and/or etching of photoresist and selective isotropic etching of semiconductor material such as polysilicon and silicon nitride using a variety of etching compositions which form reactive species in a plasma. Still more particular, the present invention further relates to such an apparatus for anisotropic etching of semiconductor material in a chamber employing a downstream plasma afterglow which is subjected in situ to radio frequency (RF) power.

Plasma stripping and etching are generally well-known techniques used in the fabrication of semiconductor devices and integrated circuits, wherein a gas composition which has been disociated into radicals and positive and negative ions react with unprotected areas of, for example, photoresist and semiconductor material. These techniques have achieved wide acceptance in the semiconductor industry because they are dry and exceptionally clean, eliminate processing and handling steps previously necessary in chemical etching, and use only small quantities of safe and inexpensive gases, thus avoiding the necessity for storage and use of large quantities of expensive noxious and difficult to dispose of solvents and acids. Moreover, plasma etching techniques offer a high potential of resolution capability and reliability for high density processing over conventional known wet chemical processing techniques.

One such plasma etching technique is known from U.S. Pat. No. 4,065,269, which generally discloses plasma etching using a microwave afterglow. In this technique, the plasma is created outside the etching chamber in an upstream microwave reactor with the reactive species, i.e., microwave afterglow, being transported to the chamber where plasma etching takes place. Etching using a microwave afterglow has been reported as being used for stripping the remaining photoresist from a substrate, as well as to selectively remove semiconductor material such as polysilicon and silicon nitride by isotropic etching through a mask. Although plasma etching using a microwave afterglow is generally known, the disclosed microwave reactor for generating the reactive species and etching chamber where the plasma etching takes place, suffer from a number of disadvantages. For example, by employing the microwave reactor substantially upstream of the etching chamber, frequent collision of the reactive species while being transported to the etching chamber results in their recombination into inactive species thereby adversely affecting the rate of etching. In addition, the known microwave reactor is relatively complex in construction and relatively inefficient, vis-a-vis microwave coupling to generate a plasma, in providing a continuous source of reactive species to the etching chamber. Overall, the known microwave reactor and etching chamber, although apparently suitable for laboratory use, is constructed in a manner which renders it unsuitable for scale-up and use in commercial plasma etching as required in the highly automated semiconductor industry.

In the manufacture of semiconductor devices and integrated circuits, there is the necessity of selectively modifying the electrical and physical properties of the substrates from which the devices and circuits are to be made. In recent years, there has been an ever increasing trend towards large scale integration in the manufacture of such diverse devices as 16-bit microprocessors, 256K and up memory chips, etc. Because of the extremely high component density in such devices, the line widths which are required to fabricate and interconnect these devices on semiconductor chips approach submicron dimensions. Isotropic etching tends to undercut the photoresist at the photoresist-semiconductor interface as a result of isotropic etching characteristically having etch rate which is the same in all directions. The practical effect of this undercutting is that line widths formed in these device are substantially narrower than those which were contained in the overlying photoresist mask.

One solution to this problem is the use of anisotropic etching as generally known from U.S. Pat. No. 4,253,907. Anisotropic etching requires the use of an etching chamber having the semiconductor wafer supported by an electrode which is connected to an RF power source. The RF voltage dropped between the plasma and the electrode results in a large DC bias which accelerates positive ions towards the electrode supported wafer, resulting in anisotropic etching. There is also known from U.S. No. 4,282,267 an apparatus for generating a plasma suitable for anisotropic etching using a combination of reactive species. The reactive species, each having different activation levels, are separately subjected to microwave and RF power sources within a common batch type plasma reactor. However, this known plasma reactor also suffers from a number of disadvantages as well. For example, this plasma reactor, by being a batch processor, does not lend itself readily for integration in a highly automated semiconductor devices manufacturing process. As a batch type plasma reactor, there further requires extensive manual handling of the wafers which can result in their contamination and/or damage. Furthermore, because of the large number of wafers contained in each batch load, etching is often not very uniform between wafers positioned at various locations within the reactor. This is a severe disadvantage when anisotropic etching is employed to manufacture semiconductor devices which require line widths having submicron dimensions.

SUMMARY OF THE INVENTION

It is broadly an object of the present invention to provide a microwave apparatus for generating plasma afterglows which overcomes or avoids one or more of the foregoing disadvantages resulting from the use of the above-mentioned known plasma generating apparatus, and which fulfills the specific requirements of a reactor for plasma afterglow stripping and/or etching photoresist and selective isotropic and anisotropic etching of semiconductor material through patterned masks.

Another object of the present invention is to provide a microwave apparatus for generating plasma afterglows which prevents exposure of semiconductor wafers to potential damaging UV light and ion bombardment while stripping photoresist or selective isotropic or anisotropic etching of semiconductor material using a flowing microwave afterglow of reactive species.

Figure 13:
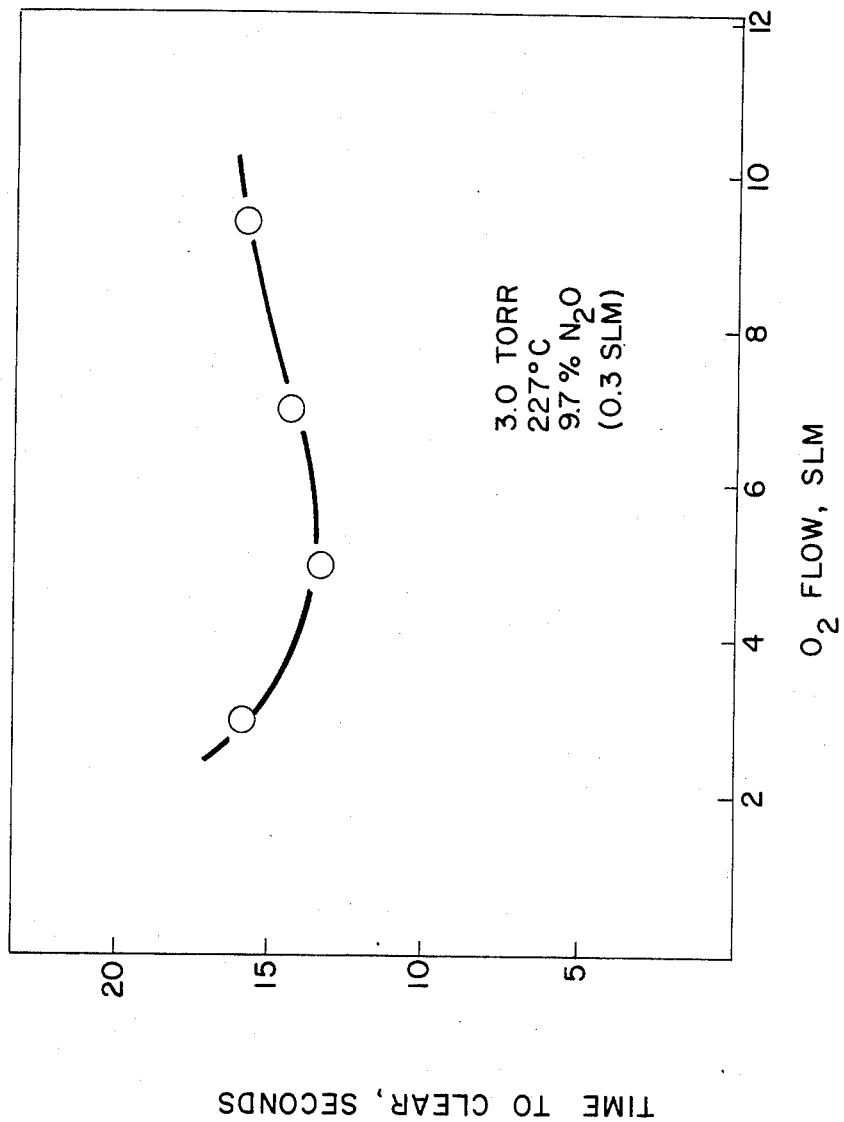
Figure 14:
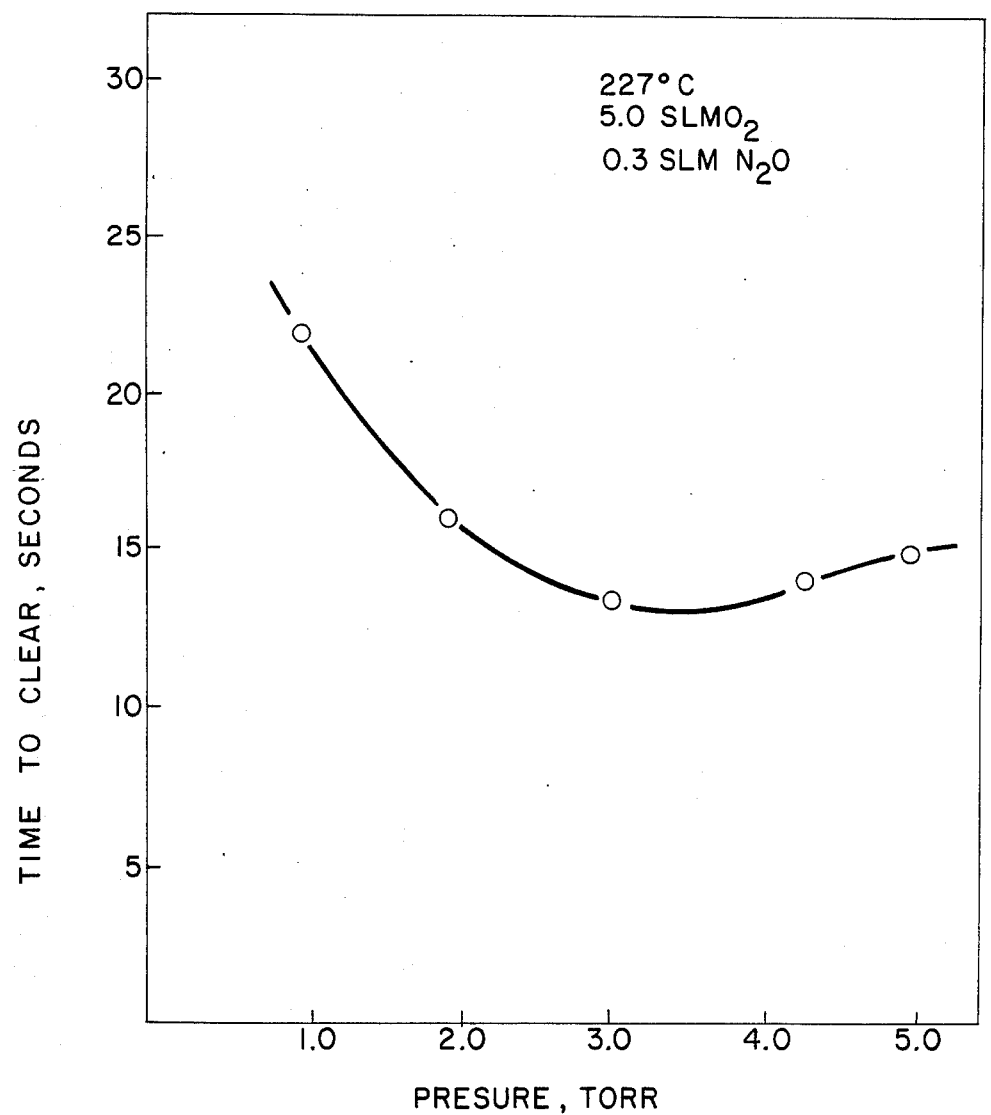
Figure 15:
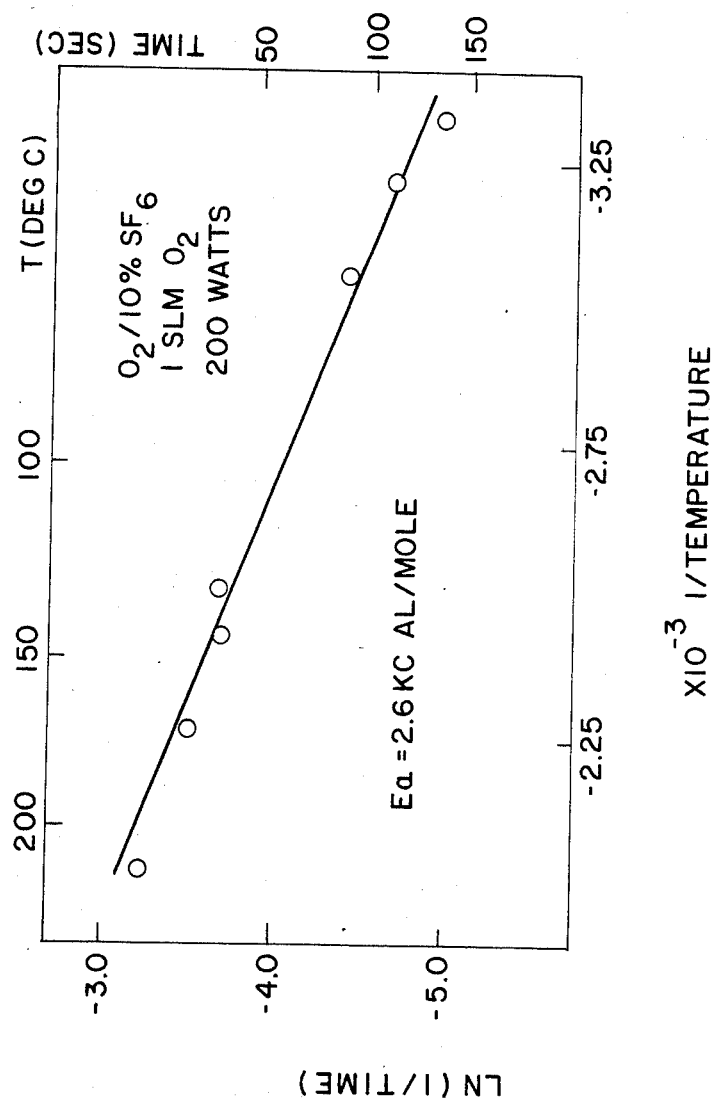

Another object of the present invention is to provide a microwave apparatus for generating plasma afterof increased oxygen flux over the wafer by increasing the gas flow rate for various reactive species;

FIG. 13 is a graph illustrating the dependency of the process time for stripping a given thickness of photoresist material as a function of increased oxygen flux over the wafer by increasing the gas flow rate for a mixture of oxygen containing the addition of nitrous oxide as the reactive species;

FIG. 14 is a graph illustrating the dependency of the process time for stripping a given thickness of photoresist material as a function of etching chamber pressure using a mixture of oxygen and nitrous oxide as the reactive species; and FIG. 15 is a graph illustrating the dependency of the etch rate for stripping photoresist material as a function of wafer temperature and etching time with the addition of a fluorine containing compound to oxygen as the reactive specie.

DETAILED DESCRIPTION

Referring now to the drawings, wherein like reference numerals represent like elements, there is disclosed in FIG. 1 a microwave apparatus for generating plasma afterglows generally designated by reference numeral 100. The apparatus 100 is constructed of a main frame 102 supporting a semiconductor wafer cassette 104 containing a plurality of individually stacked semiconductor wafers 106. The wafer cassette 104 is supported by an indexing assembly 108 adapted for indexing the wafer cassette in a general vertical direction by, for example, a hydraulic or pneumatic device. A cassette conveyor assembly 110 is attached to the main frame 102 adjacent the wafer cassette 104. The conveyor assembly 110 is constructed of a retractable, longitudinally extending guide 112 having a gripper 114 positioned at the free end thereof for releaseably engaging a wafer 106. The conveyor assembly 110 is operative for transporting wafers 106, as guided by guide rollers 116, between the wafer cassette 104 and a stripping/etching chamber 118.

The stripping/etching chamber 118 is constructed generally of a hollow chamber bottom 120 and an overlying hollow chamber cover 122. The chamber bottom 120 is fixedly supported by a bracket 124 extending from a secondary frame 126. In turn, the chamber cover 122 is movably supported for vertical displacement by means of a lifting assembly 128, for example, a hydraulic or pneumatic device. Alternatively, the chamber cover 122 can be fixedly supported by bracket 124 while the chamber bottom 120 is movably supported by lifting assembly 128. In either construction, the chamber bottom 120 is connected to a motor driven vacuum pump 130 by means of a pipe 132.

A microwave power supply 134 having a conventional magnetron launcher 136 attached thereto is supported by the secondary frame 126 overlying a portion of the stripping/etching chamber 118. A microwave reactor 137 is constructed of an elongated, rectangular-shaped waveguide resonant cavity 138 attached in vertical orientation to the power supply 134 and directly arranged overlying the stripping/etching chamber 118. As shown in phantom, a portion of the magnetron launcher 136 extends into an interior portion of the waveguide resonant cavity 138 adjacent its lower end. A contoured, microwave plasma tube 140 extends longitudinally through the waveguide resonant cavity 138 without interference from the magnetron launcher 136. The lower extending end of the microwave plasma tube 140 is slidingly received within a Teflon bearing block 142 supported by the secondary frame 126, and is attached by a vacuum seal to the chamber cover 122 in fluid communication with the interior of the stripping/etching chamber 118. The upper extending end of the microwave plasma tube 140 is attached to a flexible stainless steel pipe 144, which is in turn attached to a rigid stainless steel pipe 146 for receiving a gas supply of reactive species.

As a result of the foregoing description, the microwave plasma tube 140 is fully movable in a vertical direction relative to the waveguide resonant cavity 138 and power supply 134 along its longitudinal axis upon movement of the chamber cover 122 of the stripping/etching chamber 118 during the opening and closing thereof. In this regard, the vertical movement of the microwave plasma tube 140 is permitted by the coupling of its upper extending end to the rigid pipe 146 by means of the flexible pipe 144. In turn, vertical movement of the microwave plasma tube 140 is stabilized by the bearing block 142. The microwave reactor 137 is further provided with a pair of spaced-apart fine tuning screws 148 and a mercury/argon plasma ignitor 150 supported within a holder 152 attached adjacent the upper end of the waveguide resonant cavity 138.

One application to which the apparatus 100 is uniquely suited is the stripping and/or etching of photoresist from semiconductor wafers, which includes ion implanted resists, deep UV hardened resists, as well as resists after all etch processes. In addition, the apparatus 100 may be employed for selective isotropic etching of polysilicon and silicon nitride where anisotropy is not required. A plasma is generated within that portion of the microwave plasma tube 140 contained within the waveguide resonant cavity 138 remote from the wafer 106 contained within the stripping/etching chamber 118. Because the plasma is confined to the microwave plasma tube 140, the wafer 106 is not exposed to any potentially damaging electron or ion bombardment. The extreme high intensity plasma generated by the microwaves being emitted from the magnetron launcher 136, allows for the concentration of long-lived atomic species, which then flow downstream to react chemically with the wafer 106 or deposited photoresist. As the wafer 106 is not exposed to ion bombardment, etching is strictly by a chemical mechanism and is therefore isotropic. A significant advantage of etching using an afterglow is that there is little possibility of inducing radiation damage, which is especially important in photoresist stripping applications. The method and apparatus 100, as to be described in further detail, results in a photoresist stripping or etching rate of several microns per minute, which enables single wafer processing in a fully automated apparatus. In this regard, the apparatus 100, as a photoresist stripper, as well as for achieving isotropic etching of polysilicon and silicon nitride material, can be designed for high uniformity, while the stripping and/or etching of each wafer 106 can be monitored individually, ensuring complete processing of each wafer with a minimum of over-etch time.

Figure 2:
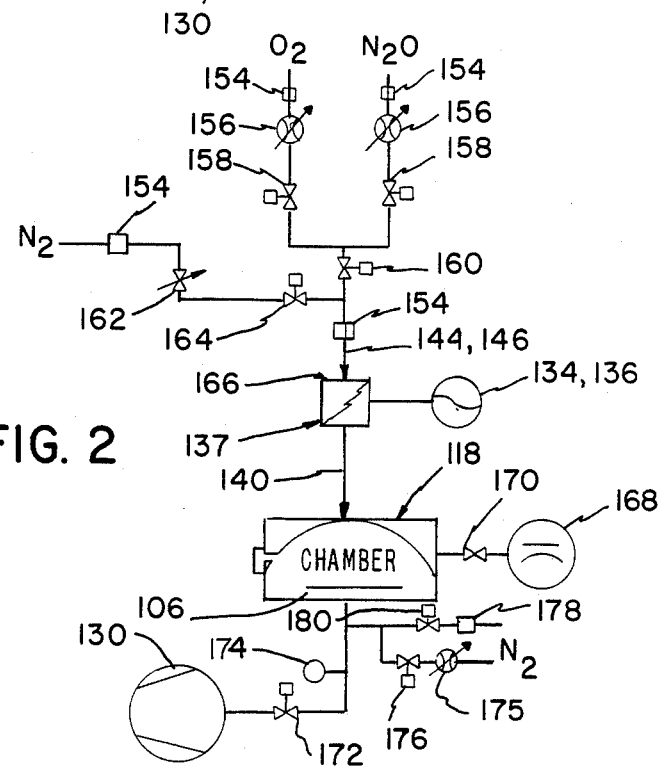
FIG. 2 is a schematic illustration of the gas flow and vacuum arrangement for the microwave apparatus as shown in FIG. 1.

Turning now to FIG. 2, there is substantially shown the gas flow and vacuum arrangement for the stripping of photoresist in accordance with one embodiment of the present invention using a microwave generated plasma from a gas composition of oxygen and nitrous oxide. A supply of oxygen and nitrous oxide are fed along parallel paths through respective gas filters 154, mass flow controllers 156 and air actuated valves 158 to a common air actuated shut-off valve 160. A source of inert gas, for example, nitrogen and the like, is supplied through a gas filter 154, a metering valve 162 and a shut-off valve 164, to a location downstream of valve 160. The combined gases are fed through an additional gas filter 154 to the microwave reactor 137, which includes a microwave energy sensor 166. The resulting microwave afterglow is fed downstream to the stripping/etching chamber 118 by the extended lower end of the microwave plasma tube 140. Pressure within the stripping/etching chamber 118 is monitored by means of a pressure gauge 168 provided with an on/off valve 170. The stripping/etching chamber 118 is drawn down under vacuum by means of the vacuum pump 130 provided with an air actuated shut-off valve 172 and pump on sensor 174 arranged in line with pipe 132. The nitrogen source is also supplied as a ballast to the vacuum pump 130 through a pressure controller 175 and shut-off valve 176. Additionally, an atmospheric pressure sensor 178 having a shut-off valve 180 is arranged in fluid communication with the stripping/etching chamber 118. Each of the above-mentioned valves and mass flow controllers can be solenoid operated and connected to a computer for automatic operation.

Figure 3:
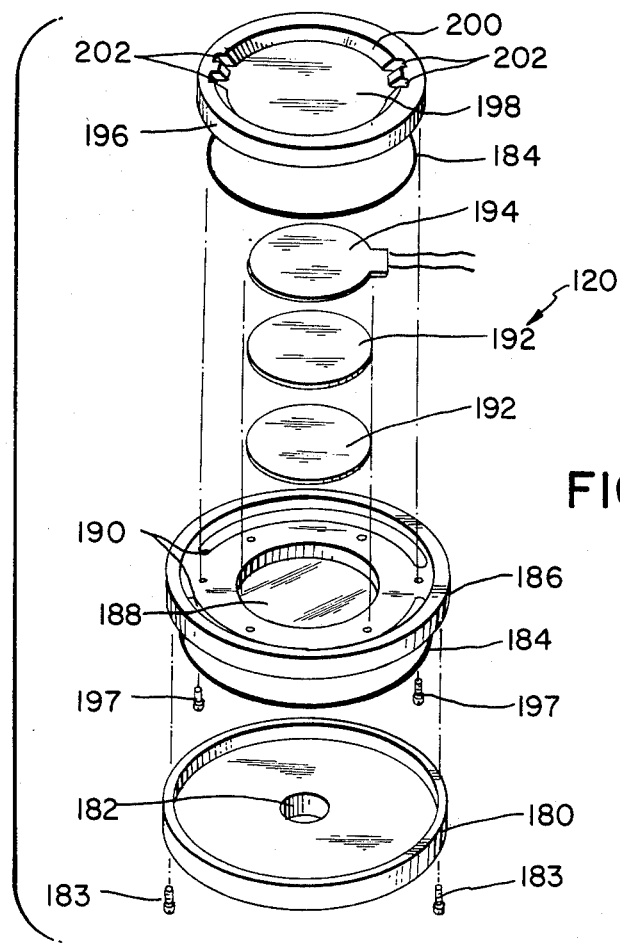
FIG. 3 is an exploded perspective view of the various components of one embodiment of the stripping/etching chamber as shown in FIG. 1, and illustrating heating means for heating a semiconductor wafer which is supported by a self-aligning plate.
Figure 4:
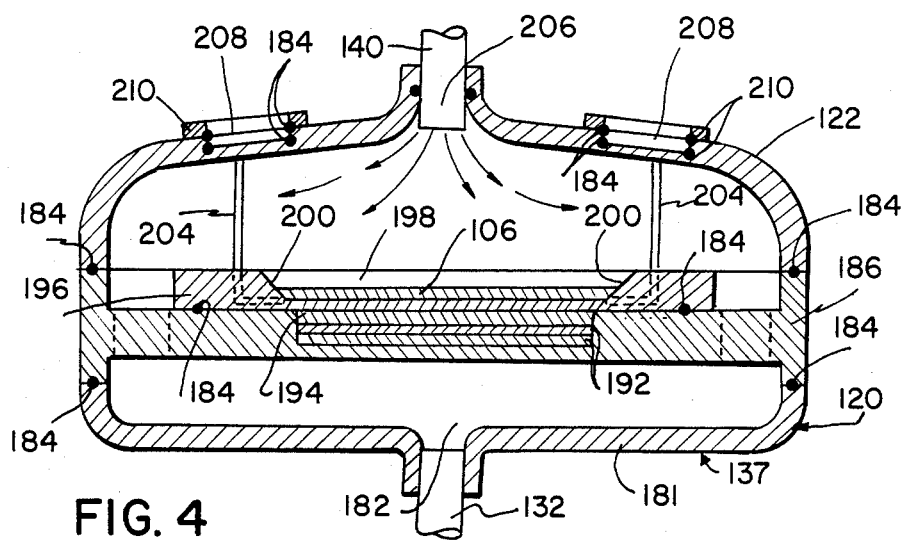
FIG. 4 is a cross-sectional view of the stripping/etching chamber as generally shown in FIG. 3, which is adapted for plasma stripping and/or etching of photoresist material and selective isotropic etching of semiconductor material.

Turning now to FIGS. 3 and 4, the construction of the stripping/etching chamber 118 for stripping photoresist material, as well as for isotropic etching of polysilicon and silicon nitride material will now be described. The chamber bottom 120 is constructed of a hollow dish-shaped bottom 181 having a central opening 182 to be connected to the vacuum pump 130 via pipe 132. The upper peripheral edge of the bottom 181 supports in sealed engagement, by means of an O-ring 184 and a plurality of bolts 183, a support ring 186. The support ring 186 is provided with a central recessed portion 188 and circumscribing annular-shaped openings 190 which provide communication between the hollow interior of the chamber cover 122 and the dish-shaped bottom 181. A pair of circular-shaped heat insulating elements 192, preferably of Teflon, are disposed within the recessed portion 188. Supported by the insulating elements 192 and contained within the recessed portion 188 is a circular-shaped resistive heating element 194. A wafer support plate 196 is supported on the upper surface of the support ring 186 overlying the heating element 194 and sealed thereto by means of an O-ring 184 and a plurality of bolts 197.

As shown, the outside diameter of the wafer support plate 196 is slightly smaller than the inside diameter of the annular-shaped openings 190, thereby preventing its obstruction. The wafer support plate 196 includes a recessed portion 198 formed by inwardly bevelled side walls 200. Two pairs of radially opposed cutouts 202 are provided within the bevelled side walls 200 to each releasably receive L-shaped forks 204 which are attached to the chamber cover 122. The chamber cover 122 is provided with a central opening 206 which is vacuum sealed to the extended lower end of the microwave plasma tube 140 by means of an O-ring 184. In addition, the chamber cover 122 is provided with a pair of sight glasses 208 sealed by means of O-rings 184 and bezel 210.

As there is a tendency for plasma generated atoms to catalytically recombine on the walls of the stripping/etching chamber 118, the chamber is constructed of material which has a very low catalytic activity towards recombination of the reactive species. For example, the stripping/etching chamber 118 can be constructed of aluminum alloy, such as Alloy 6063 which contains silicon, as opposed to copper which has a very high catalytic activity. In addition, the interior of the stripping/etching chamber 118 can be hard anodized to produce a thick coating of aluminum oxide on the interior surfaces thereof. The resulting construction of the stripping/etching chamber 118 will ensure that high concentrations of atoms from the microwave reactor 137 will be available at the wafer surface to achieve the desired stripping of photoresist material or isotropic etching of polysilicon and silicon nitride material.

Figure 5:
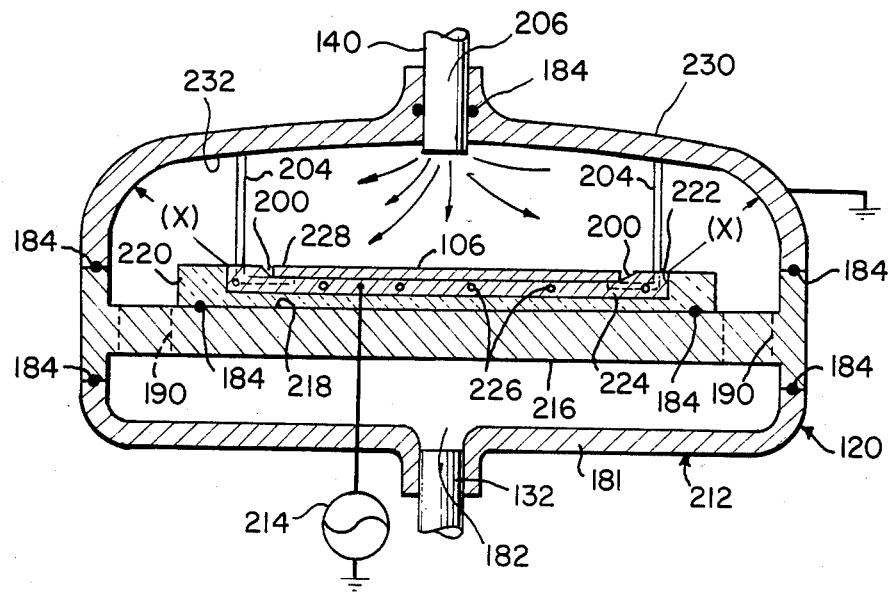
FIG. 5 is a cross-sectional view of another embodiment of the stripping/etching chamber as shown in FIG. 1, adapted for selective anisotropic etching of semiconductor material by subjecting a plasma afterglow to in situ RF power.

Turning now to FIG. 5, there is disclosed an etching chamber 212 in accordance with another embodiment of the present invention, and specifically adapted for selective anisotropic etching of semiconductor wafers 106. A single wafer anisotropic etching apparatus must, of necessity, etch at sufficiently high rates to achieve high through-puts. These high etch rates have previously been achieved by applying high power densities to the wafer 106. The application of a high power density has the disadvantage that the heat load to the wafer 106 is high, which requires either operating at high etching chamber pressures, e.g., above 1 torr, or clamping the wafer to a cooled substrate to preserve the photoresist and to keep the wafer from overheating. The result of these solutions is a restricted process window. In addition, clamping the wafer 106 to a cooled substrate requires a complex wafer handling system that is subject to poor reliability. The etching chamber 212, in accordance with the present invention, overcomes these disadvantages by decoupling etchant generation from ion production and acceleration by using two plasma sources.

As previously described, the microwave reactor 137 generates a plasma by coupling microwave power inside the microwave plasma tube 140 and outside of the etching chamber 212. In addition, an RF power is applied to the etching chamber 212 to generate a second plasma over the wafer 106. Atoms generated within the microwave plasma tube 140 flow into the etching chamber 212 and are then re-excited by the applied RF power. A high concentration of atoms and ions are therefore generated, with the ions being directed to the wafer 106 by the DC bias generated by the RF power. Because the microwave power applied to the flowing gas within the microwave plasma tube 140 is generating most of the atoms and neutral etchant species, only a relatively small amount of power need be applied to the wafer 106 to achieve directional anisotropic etching. The use of two power sources, microwave power and RF power, ensures that the etch rate for anisotropic etching can be very high, while minimizing power applied to the wafer 106. As a result, anisotropic etching over a wide pressure range is possible without having to clamp the wafer 106 to a cooled substrate for cooling purposes.

As shown in FIG. 5, the etching chamber 212 is constructed to include similar elements as the stripping/etching chamber 118 and includes a support ring 216 provided with a flat central portion 218 circumscribed by annular-shaped openings 190. An electrode support 220 having a central recessed portion 222 is supported on a central portion of the support ring 216 and sealed thereto by means of an O-ring 184. The electrode support 220 is constructed of electrically insulating material, that is, dielectric material, for example, quartz or alumina and the like. A powered electrode 224 is supported within the recessed portion 222 of the electrode support 220 and is electrically attached to an RF power supply 214. The powered electrode 224 is further provided with a plurality of continuous internal tubes 226 adapted to circulate a fluid medium for maintaining the wafer 106 at a desired temperature by either cooling or heating, as needed. The wafer 106 is supported within a central recessed portion 228 having inwardly bevelled side walls 200 formed within the surface of the electrode support 220. The chamber cover 230 is constructed such that its inside surface functions as the ground electrode 232 for the RF power supply 214.

The etching chamber 212 is specifically designed to operate in the reactive ion etch or RIE mode. That is, the two RF electrodes, i.e., powered electrode 224 and ground electrode 232 are not symmetric in size. In the RIE mode, the asymmetry of these electrodes 224, 232 cause most of the RF voltage to be dropped between the plasma and the smaller powered electrode 224. Generally, the ratio of the areas of the two electrodes 224, 232 should be at least 2.5. By placing the wafer 106 on the smaller powered electrode 224, this ensures that a large voltage drop will be available to accelerate positive ions towards the wafer 106, causing anisotropic etching. As described, the smaller powered electrode 224 is directly connected to the RF power supply 214 and the larger ground electrode 232 is at RF ground. As a result of the foregoing construction of the etching chamber 212, large DC biases can be achieved, even at relatively high etching chamber pressures, as long as the plasma fills the etching chamber 212 and contacts the interior walls uniformly. However, usually, as the pressure within the known anisotropic etching chambers is raised, the plasma begins to collapse over the powered electrode, i.e.. cathode. This typically results because the design of the anisotropic etching chamber of known designs have not placed the grounded surfaces equally distanced from the powered surfaces.

In accordance with the etching chamber 212 of the present invention, every point on the ground electrode 232 is a constant distance (X) from the powered electode 224. This is achieved by the ground electrode 232 having a central portion parallel to the surface of the powered electrode 224 and end portions having a radius (X) from the upper corners of the powered electrode. Thus, there is no tendency for the plasma within the etching chamber 212 to collapse. In accordance with one embodiment, for a powered electrode 224 having a diameter of 9 inches, i.e., a size suitable for an 8 inch wafer 106, a ground-to-powered area ratio of 2.5 will require that the grounded electrode 232 have an area of 159 square inches. In accordance with another embodiment of the present invention, the interelectrode distance (X) is 3.5 inches, resulting in a ground-to-powered area ratio of somewhat higher than 2.5. The powered electrode and ground electrode 224, 232 can be constructed of aluminum or graphite.

Referring now to FIGS. 6-9, the construction of the microwave reactor 137 will be described. A known characteristic of microwave plasmas is that the microwave energy must be coupled to the plasma through a resonant cavity, i.e., waveguide resonant cavity 138. The resonant cavity produces a high density electric field which ionizes the contained gas, forming the plasma. Many types of cavities have been proposed and are in use to generate plasmas. However, in general, the known resonant cavities are more suited for laboratory production of plasmas rather than for industrial application. In addition, these known laboratory resonant cavities are complex in design, difficult to tune, and provide inefficient coupling of microwave energy to the plasma.

The microwave reactor 137 of the present invention is constructed of an elongated hollow waveguide resonant cavity 138 maintained at atmospheric pressure. The waveguide resonant cavity 138 has inside dimensions of $11'' \times 3.25'' \times 1.5''$, as well as being constructed of various materials such as aluminum, brass, copper and the like. The magnetron launcher 136 extends into the interior of the waveguide resonant cavity 138 along the longitudinal axis thereof, and is displaced approximately 0.812 inches from the interior surface of end wall 234. Alternatively, the magnetron launcher 136 can be positioned adjacent the other end wall 236, with the microwave plasma tube 140 arranged appropriately. The microwave cavity 138 and magnetron launcher 136, as thus far described, are available from Cober Electronics of Stamford, Conn. In order to achieve the most efficient coupling of microwave energy into the microwave plasma tube 140, it is preferred that the distance between the magnetron launcher 136 and the other end wall 236 of the waveguide resonant cavity 138 be 2.13 wavelengths measured in free space or 2.0 wavelengths measured in the cavity. When employing microwave power at a frequency of 2450 MHz, this distance corresponds to 10.188 inches, while corresponding to 27.279 inches when employing microwave power at a frequency of 915 MHz.

The end walls 234, 236 are provided with openings 238 of sufficient size to allow the opposite ends of the microwave plasma tube 140, to pass therethrough without interference or engagement. As a result, the microwave plasma tube 140 can be moved along its longitudinal axis relative to the stationary waveguide resonant cavity 138, which is maintained in its fixed position by being mounted to the microwave power supply 134. This relative movement between the microwave plasma tube 140 and waveguide resonant cavity 138 is required due to the attachment of the microwave plasma tube to the chamber covers 122, 230 of the stripping/etching chamber 118 and etching chamber 212, which as previously described, are arranged for vertical movement by means of lifting assembly 128. One fine tuning screw 148 is located adjacent end wall 236 of the waveguide resonant cavity 138 at a location corresponding to the location of maximum microwave energy. The other fine tuning screw 148 is located inwardly thereof at a distance of approximately one-half wavelength. The fine tuning screws 148 allow for the maximum coupling of microwave energy into the microwave plasma tube 140.

Figure 6:
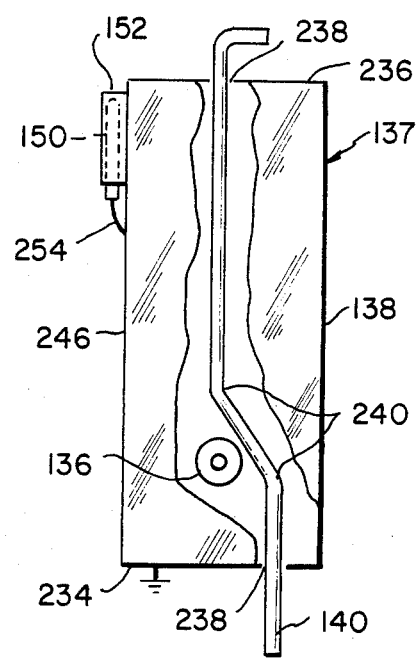
FIGS. 6 and 7 are front elevational views of the microwave reactor as shown in FIG. 1, having a front portion thereof removed, and illustrating the design, construction and arrangement of a microwave plasma tube in accordance with two embodiments of the present invention.

In accordance with one embodiment of the microwave plasma tube 140, as shown in FIG. 6, such tube is constructed of a one-half inch inside diameter quartz or aluminum tube. The lower end of the microwave plasma tube 140 is provided with a double bend 240 such that its upper portion can be arranged along the longitudinal axis of the waveguide resonant cavity 138, i.e., location of maximum coupling efficiency of microwave energy. However, it has been found that where maximum coupling efficiency has been obtained, the plasma created within the microwave plasma tube 140 is unstable and is sometimes extinguished. It has been found that by arranging the longitudinal axis of the microwave plasma tube 140 slightly adjacent the longitudinal axis of the waveguide resonant cavity 138, for example, as much as one-quarter of an inch off-center, a more stable sustaining plasma is generated without a significant reduction in coupling efficiency of microwave power.

Figure 7:
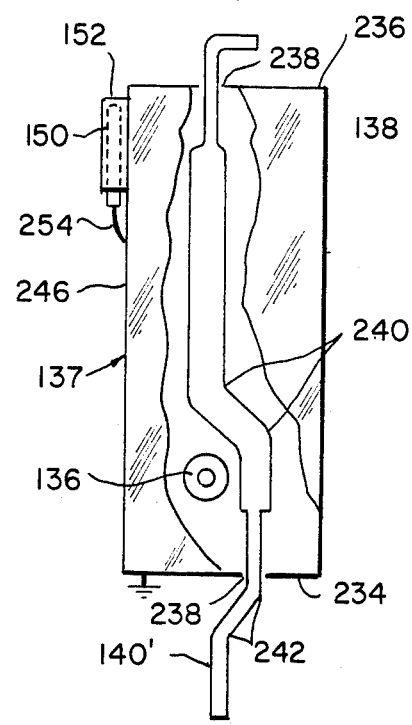

In accordance with another embodiment of the present invention as shown in FIG. 7, the microwave plasma tube 140' has an inside diameter of one inch and includes an additional double bend 242 at its lower end which extends outwardly of the waveguide resonant cavity 138. This second double bend 142 prevents ultraviolet light (UV) which is generated in the plasma confined by the microwave plasma tube 140' within the waveguide resonant cavity 138, from shining directly on a wafer 106 within the stripping/etching chamber 118 or etching chamber 212. That is, the microwave plasma tube 140, as shown in FIG. 6, has its lower end, which extends into the stripping/etching chamber 118 or etching chamber 212, arranged in colinear alignment with that portion of the microwave plasma tube contained within the waveguide resonant cavity 138. As a consequence, UV light generated in the plasma at such location, can potentially expose an underlying wafer 106. It is generally known that the exposure of semiconductor transistors of the MOS type to UV light can cause defects in the transistor due to radiation damage. Accordingly, the double bend 242, by shifting the lower end of the microwave plasma tube 140' out of colinear alignment with that portion of the microwave plasma tube confined within the waveguide resonant cavity 138, prevents potential UV light exposure to an underlying wafer 106.

The use of a one-half inch microwave plasma tube 140 requires a certain degree of fine tuning using the fine tuning screws 148. On the other hand, it has been found that the use of the one inch microwave plasma tube 140' requires little, if any, fine tuning. In addition, the one inch microwave plasma tube 140' has an additional advantage of providing a more even distribution of plasma over the wafer 106 contained within the stripping/etching chamber 118 or etching chamber 212.

A generally known difficulty in operating microwave plasmas is in reliably igniting of the plasma. Gases like argon will ignite easily, but highly electro-negative gases like oxygen will not self-ignite under microwave excitation. As such, an alternate ignition source is required, such as a Tesla coil, which provides a high voltage spark. However, the use of a Tesla coil adds complexity to the system and may cause reliability problems. As shown in FIGS. 6–8, a mercury/argon plasma ignitor 150 is provided within a holder 152 mounted to side wall 246 of the waveguide cavity 138. An opening 248 is provided within the side wall 246 in alignment with the microwave plasma tube 140 and the plasma ignitor 150. As shown in FIG. 9, the plasma ignitor 150 is constructed of a small sealed quartz tube 250 containing about 1 to 20 torr of argon with a small drop of mercury 252. By applying a potential to the plasma ignitor 150 via electrical line 254, ultraviolet light is emitted by the creation of plasma which, in turn, will generate electrons through the action of photons in the microwave plasma tube 140 to ignite a plasma therein.

In accordance with another embodiment of the plasma ignitor 150, the quartz tube 250 may be extended through the opening 248 and into the interior of the waveguide resonant cavity 138. By properly locating the quartz tube 250, the microwave energy supplied in the waveguide resonant cavity 138 will efficiently couple to the quartz tube and create a plasma from the contained mercury and argon which, in turn, will emit ultraviolet light. The intense ultraviolet light emission from the quartz tube 250 will, as described, ignite a plasma in the adjacent microwave plasma tube 140. This embodiment provides a passive mercury/argon plasma ignitor 150 having a high degree of reliability. In addition to acting as a plasma ignitor, the mercury/argon plasma ignitor 150 will function as a tuning stub for the waveguide resonant cavity 138. By adjusting the position of the quartz tube 250 within the waveguide resonant cavity 138, the microwave energy can be better matched to the plasma load.

In operation of the microwave afterglow apparatus 100, as shown in FIG. 1, the microwave reactor 137 is positioned close to the stripping/etching chamber 118 to prevent excessive loss of the reactive species. As previously noted, the highly reactive nature of the reactive specie generated by the plasma causes rapid loss of these species through collision with the microwave plasma tube 140. As a result of the construction and arrangement of the apparatus 100, as well as the close coupling of the microwave reactor 137 to the stripping/etching chamber 118, there is ensured maximum utilization of the active gases produced by the plasma within the microwave reactor.

Wafers 106 are transported from the wafer cassette 104 to the stripping/etching chamber 118 by means of the cassette conveyor assembly 110. As the wafers 106 approach the stripping/etching chamber 118, lifting assembly 128 is activated to raise the chamber cover 122 which, at the same time, lifts the forks 204 from their resting position within the cutouts 202. When a wafer 106 enters the stripping/etching chamber 118, the wafer is engaged by the forks 204, and the guide 112 of the cassette conveyor assembly 110 is then retracted. As the chamber cover 122 is lowered, the peripheral edge of the wafer 106, when not centered, will engage the bevelled side wall 200 of the wafer support plate 196 thereby providing self-alignment of the wafer, which will now rest firmly in contact with the bottom surface of the recessed portion 198. The wafer 106 may now be conductively heated to a predetermined elevated temperature by means of the heating element 194 within the stripping/etching chamber 118. On the other hand, the wafer 106 may be heated or cooled to a desired temperature by means of fluid flowing through the heat transfer tubes 226 within the powered electrode 224 of the etching chamber 212.

Once the stripping/etching chamber 118 has been sealed, the enclosed volume is pumped down by means of vacuum pump 130 to a desired subatmospheric pressure. Reactive gases are fed through the microwave plasma tube 140 and subjected to microwave power by means of the microwave power supply 134, magnetron launcher 136 and waveguide resonant cavity 138. The resulting generated plasma flows into the stripping/etching chamber 118 to effect stripping of photoresist or isotropic etching of polysilicon or silicon nitride material. In the case of anisotropic etching using the etching chamber 212, the afterglow of the generated plasma is subjected to an applied RF power by means of the RF power supply 214. As described, the stripping/etching chamber 118 and the etching chamber 212 both employ the principle of microwave afterglow etching using reactive species emanating from the upstream microwave reactor 137. However, when employing anisotropic etching using the etching chamber 212, it is possible to eliminate the microwave reactor 137 by forming the plasma directly within the etching chamber using the RF power supply 214.

The apparatus 100 incorporating the stripping/etching chamber 118 is designed for plasma afterglow stripping and/or etching of photoresist and selective isotropic etching of semiconductor material, such as polysilicon and silicon nitride, using a variety of etchant gas compositions which form reactive species in a plasma. For example, when stripping and/or etching of photoresist, suitable gases such as $O_2$, $H_2$, $H_2O$, $N_2$ $CF_4$, $NF_3$, $SF_6$ and mixtures thereof can be used. In addition, the apparatus 100 incorporating the etching chamber 212 can be used for anisotropic etching of semiconductor material employing plasma afterglow of reactive species which are subjected in situ to RF power. When anisotropic etching is desired, suitable gases which form reactive species, for example, $CF_4$, $Cl_2$, $CCl_4$, $CHF_3$, $C_3F_8$, $CClF_3$ and mixtures thereof can be used. It is to be understood that other gases and gas compositions, which have not been specifically identified herein, may also have equal utility in the stripping and/or etching of photoresist or the selective isotropic and anisotropic etching of semiconductor material using the apparatus 100 in accordance with the present invention.

It is further contemplated that the apparatus 100 may be used for generating plasmas to achieve stripping and/or etching with RF and microwave power in the range of from about 100 to 1000 watts at an RF frequency of 13.5 MHz and a microwave frequency in the range of from about 915 MHz to 2450 MHz. However, under the standards for Industrial, Scientific and Medical apparatus (abbreviated as ISM apparatus), the permitted frequencies are 13.56 MHz, 915 MHz and 2450 MHz. Still further, the apparatus 100 may be suitably employed for stripping and/or etching of photoresist and semiconductor material, either isotropically or anisotropically, in an etching chamber maintained at a pressure in the range of from about 0.01 torr to 10 torr.

Although a variety of pure gases and gas mixtures are known as being suitable for use in the stripping of photoresist, it has been found that a gas mixture of $N_2O$ and $O_2$ is more effective as a stripping mixture than any other pure gas or gas mixture previously known. A variety of experiments were conducted using the apparatus 100 under different process conditions to determined stripping times for stripping 1.2 microns of AZ-1370 photoresist, exposed and hard baked, by employing various gas mixtures which included a quantity of $N_2O$. The photoresist stripping rates were compared with rates obtained under identical conditions employing a variety of pure gases and gas mixtures, as a control gas, which did not include $N_2O$.

The following Table I discloses the results obtained under process conditions for an etching chamber evacuated to 4.0 torr, the wafer having the photoresist deposited thereon being heated to 210° C., and using a total gas flow of 10.4 SLM (standard liters per minute).

TABLE I

|  | 4.0 torr 20% $O_2$ in AR | 210° C. $O_2$ | 10.4 SLM total gas flow AIR |
|---|---|---|---|
| 0% $N_2O$ | 53 seconds | 33 seconds | 41 seconds |
| 0.3 SLM $N_2O$ | 25 seconds | 18 seconds | 33 seconds |

The following Table II discloses the results obtained under process conditions for an etching chamber evacuated to 2.0 torr, the wafer having the photoresist deposited thereon being heated to 210° C., and using a total gas flow of 5.2 SLM.

TABLE II

|  | 2.0 torr 20% $O_2$ in AR | 210° C. $O_2$ | 5.2 SLM total gas flow AIR |
|---|---|---|---|
| 0% $N_2O$ | 102 seconds | 58 seconds | 39 seconds |
| 0.3 SLM $N_2O$ | 35 seconds | 18 seconds | 39 seconds |

The following Table III discloses the results obtained under process conditions for an etching chamber evacuated to 1.0 torr, the wafer having the photoresist deposited thereon being heated to 210° C., and using a total gas flow of 2.6 SLM.

TABLE III

|  | 1.0 torr 20% $O_2$ in AR | 210° C. $O_2$ | 2.6 SLM total gas flow AIR |
|---|---|---|---|
| 0% $N_2O$ | — | 160 seconds | 78 seconds |
| 0.3 SLM $N_2O$ | 73 seconds | 30 seconds | — |

Tables I–III disclose, in almost all cases, that the addition of $N_2O$ dramatically reduces the stripping time for the deposited photoresist. The demonstrated reduced stripping tie is less noticeable when air is used as the controlled stripping gas. It is comtemplated that this is probably due to the fact that some $N_2O$ is created in the plasma when air is passed through the microwave cavity 137 and subjected to microwave power. The results indicate that the range of 1.5% to 20% is the optimum range for $N_2O$ addition. However, the apparatus 100 as employed placed an approximate lower limit of 1.5% to the amount of $N_2O$ that could be added to the gas mixture. It is therefore comtemplated that an $N_2O$ addition of from about 0.5% to 20% would be the optimum range, the balance being $O_2$. Further, it is contemplated that improved etching rates of photoresists will be obtained by the addition of $N_2O$ into $O_2$ having a flow rate of from 1 SLM to 10 SLM, and subjected to microwave power at 400 watts using a frequency of 915 MHz or 2450 MHz.

The apparatus 100 employing a microwave reactor 137 and stripping/etching chamber 118 was used to maximize the stripping rate of 1.2 microns of AZ 1370 photoresist which was deposited on a semiconductor wafer 106, and subsequently exposed and hard baked. FIGS. 10–15 graphically illustrate the experimental results for a variety of gases and gas mixtures which were subjected to microwave power in the microwave reactor 137 to form a plasma afterglow containing the reactive species.

FIG. 10 shows the dependency of the etch rate for stripping photoresist as a function of wafer temperature and etching time using pure $O_2$ as the reactive specie. As shown, improved stripping rates were obtained by increasing the wafer temperature.

Figure 11:
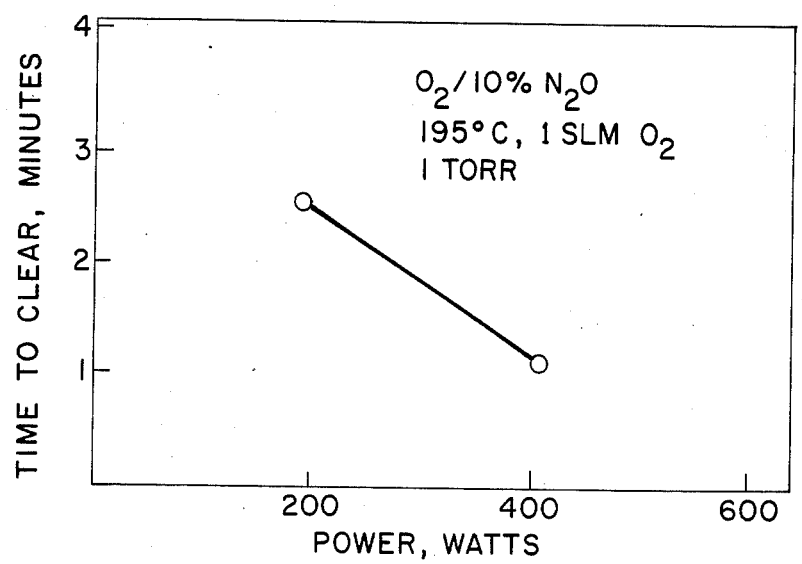
FIG. 11 is a graph illustrating the dependency of the etch rate for stripping photoresist material as a function of microwave power using a mixture of oxygen and nitrous oxide as a reactive specie.

FIG. 11 shows the dependency of the etch rate for stripping photoresist on microwave power using a mixture of $O_2$ and $N_2O$ as the reactive species. As shown, the stripping rate is substantially improved by increasing the microwave power applied in generating the plasma.

Figure 12:
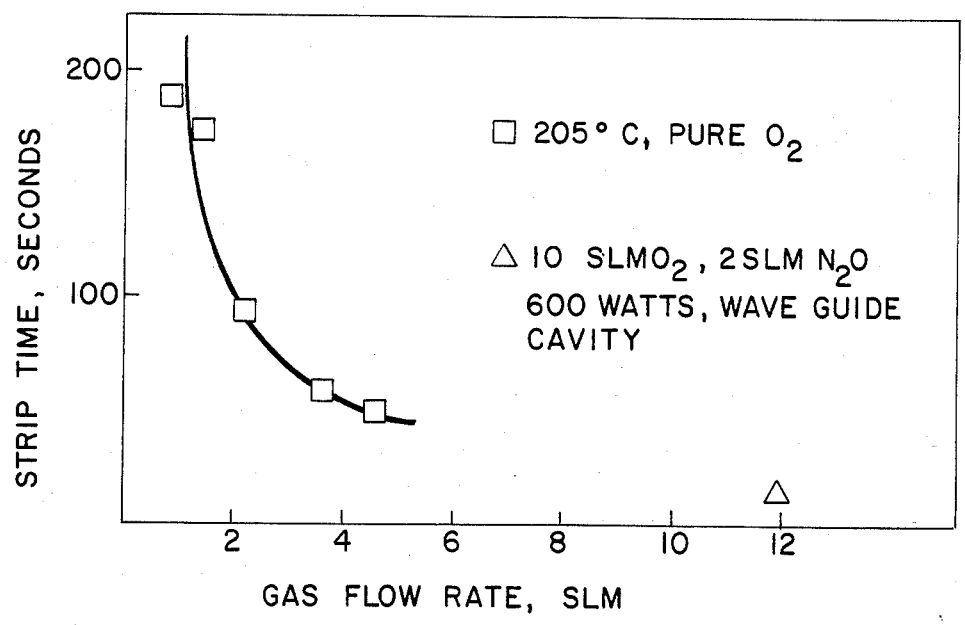
FIG. 12 is a graph illustrating the dependency of the etch rate for stripping photoresist material as a function

FIG. 12 shows the dependency of the etch rate for stripping photoresist on increased $O_2$ flux over the wafer by increasing the gas flow rate for various reactive species, i.e., pure $O_2$ and $O_2$ containing the addition of $N_2O$. As shown, increasing the $O_2$ flow rate substantially improves the stripping rate, while the addition of $N_2O$ results in a further improvement over the use of pure $O_2$.

FIG. 13 shows that the dependency of the process time for stripping photoresist on increased $O_2$ flux over the wafer by increasing the gas flow rate for a mixture of $O_2$ containing the addition of 9.7% $N_2O$. As shown, the minimum time to completely strip the photoresist occured at an $O_2$ flow of about 5.0 SLM.

FIG. 14 shows the dependency of the process time for stripping photoresist as a function of stripping/etching chamber pressure using a mixture of $O_2$ and $N_2O$ as the reactive species. As shown, the minimum process time for completely stripping the photoresist occured at a pressure of about 3.0 torr.

FIG. 15 shows the dependency of the etch rate for stripping photoresist as a function of wafer temperature and etching time using a mixture of $O_2$ and $SF_6$ as the reactive species. As shown, the stripping rate is substantially improved by increasing the temperature of the wafer in a similar manner as the results shown in FIG. 10. However, a comparison of the results shown in FIGS. 10 and 15 evidence that the addition of $SF_6$ to $O_2$ results in a substantial increase at a given temperature in the stripping rate over the use of pure $O_2$.

In addition to stripping and/or etching of photoresist and selective isotropic etching of semiconductor material, the apparatus 100 can also be used in selective anisotropic etching of a masked wafer. In this regard, reactive species are formed in a plasma generated within the microwave reactor 137 while being subjected to microwave power. By application of RF power within the etching chamber 212, positive ions are generated in the plasma afterglow and are accelerated towards the wafer 106. The temperature of the wafer is controlled, for example, in the range of 0° C. to 50° C., by fluid flowing within the heat transfer tubes 226 disposed within the powered electrode 224.

In accordance with one example of anisotropic etching, a microwave reactor 137 is supplied with a gas mixture of $SF_6$ at 0.1 SLM and $CF_4$ at 0.01 SLM. The gas composition is subjected to 400 watts of microwave power at a frequency of 2450 MHz within the microwave reactor to form the reactive species. The afterglow is transported into the etching chamber which is maintained at 0.5 torr for etching a photoresist masked polysilicon wafer maintained at a temperature of 15° C. The wafer is subjected to an RF power of 1 watt per square centimeter of wafer using an RF frequency of 13.5 MHz. An etch rate of 6500 angstroms per minute was observed with minimal undercutting.

It should now be apparent that the microwave afterglow apparatus 100, as constructed in accordance with the thus described embodiments of the present invention, can be used for stripping and/or etching of photoresist and isotropic and anisotropic etching of semiconductive material which achieves the specific objectives for such an apparatus as discussed in this application. Although the invention herein has been described with reference to particular embodiments, it is to be understood that these embodiments are merely illustrative of the present application of the present invention. For example, the apparatus of the present invention may be used to deposit a thin layer of silicon nitride on a silicon wafer by exposing the wafer to a plasma in which the reactive species are silane and ammonia. The silicon nitride film which is deposited on the wafer is then used as a mask in subsequent processing of the wafer. It is therefore to be understood that numerous modifications may be made in the illustrative embodiments and that other arrangements may be devised without departing from the spirit and scope of the present invention as defined by the appended claims.

What is claimed is:

1. An apparatus for treating a workpiece by a plasma formed from a gas, said apparatus comprising a resonant cavity positioned within said apparatus, transporting means extending through said resonant cavity for transporting a gas therethrough from a source thereof, said transporting means arranged to permit the movement thereof relative to said resonant cavity, a source of energy connected to said resonant cavity for generating a plasma from said gas within said transporting means, a process chamber having a portion movable between an open position and a closed position for receiving a workpiece within said process chamber, said transporting means connected to said portion for transporting said plasma to said process chamber for treating said workpiece, whereby said relative movement between said transporting means and said resonant cavity permits said resonant cavity and said source of energy to remain stationary during the opening and closing of said process chamber.

2. The apparatus of claim 1 wherein said source of energy comprises microwave power.

3. The apparatus of claim 1 wherein said resonant cavity comprises an elongated, rectangular-shaped cavity having a longitudinal axis.

4. The apparatus of claim 3 wherein said source of energy includes a protruding portion extending into said resonant cavity.

5. The apparatus of claim 4 wherein said transporting means includes a first displaced portion arranged adjacent said protruding portion.

6. The apparatus of claim 5 wherein said transporting means includes a linear portion arranged substantially parallel to said longitudinal axis of said cavity.

7. The apparatus of claim 5 wherein said transporting means includes a second displaced portion arranged outside said resonant cavity, whereby a portion of said transporting means exiting said resonant cavity is displaced from a portion of said transporting means entering said process chamber.

8. The apparatus of claim 1 further including means for generating ultraviolet light, said means arranged for directing said ultraviolet light into a portion of said transporting means within said resonant cavity, whereby said ultraviolet light ignites said plasma therein.

9. An apparatus for treating a workpiece by a plasma formed from a gas, said apparatus comprising plasma forming means for forming a plasma therein from said gas, said plasma forming means including first energy applying means for applying a first energy to said gas for forming said plasma, a process chamber for receiving a workpiece arranged in fluid communication with said plasma forming means for receiving said plasma therein, and second energy applying means for applying a second energy to said plasma within said process chamber to achieve treating of said workpiece, said plasma forming means arranged spaced apart from said process chamber to isolate said first energy from said workpiece within said process chamber, whereby said workpiece is treated within said process chamber by said plasma therein while being subjected to said second energy.

10. An apparatus according to claim 9, wherein said process chamber includes a support for said workpiece, said support including means for controlling the temperature of said workpiece.

11. An apparatus according to claim 10, wherein said support includes means for centering said workpiece thereon.

12. An apparatus according to claim 9, wherein said first energy applying means comprises a microwave power source and said second energy applying means comprises a radio frequency power source.

13. An apparatus according to claim 9, wherein said process chamber includes a pair of spaced-apart electrodes of unequal surface area, the distance between said electrodes being substantially constant.

14. An apparatus according to claim 13, wherein one of said electrodes includes a curved peripheral portion having a radius of curvature corresponding to the constant distance between said electrodes.

15. An apparatus according to claim 9, wherein said plasma forming means includes a resonant cavity and transporting means extending through said resonant cavity for transporting a gas therethrough from a source thereof, said transporting means arranged to permit the movement thereof relative to said resonant cavity, said process chamber having a portion movable between an open position and a closed position for receiving said workpiece, said transporting means connected to said portion of said process chamber for transporting said plasma to said process chamber for treating said workpiece, whereby the relative movement between said transporting means and said resonant cavity permits said resonant cavity and said first energy applying means to remain stationary during the opening and closing of said process chamber.

16. An apparatus according to claim 15, wherein said resonant cavity comprises an elongated, rectangular-shaped cavity having a longitudinal axis along which said first energy is propagated.

17. An apparatus according to claim 15, wherein said transporting means includes a linear portion arranged substantially parallel to the longitudinal axis of said resonant cavity.

18. An apparatus according to claim 15, wherein said transporting means includes a displaced portion arranged outside said resonant cavity, whereby a portion of said transporting means exiting said resonant cavity is displaced from a portion of said transporting means entering said process chamber.

19. An apparatus according to claim 15, further including generating means for generating ultraviolet light, said generating means arranged for directing said ultraviolet light into a portion of said plasma forming means, whereby said ultraviolet light ignites said plasma therein.

20. An apparatus for treating a workpiece by a gas, said apparatus comprising a process chamber for receiving a workpiece, a pair of spaced-apart electrodes within said process chamber, and energy applying means coupled to said electrodes for applying energy to said gas within said process chamber to achieve treating of said workpiece, wherein the distance between said electrodes is substantially constant with one of said electrodes having a curved peripheral portion having a radius of curvature corresponding to the constant distance between said electrodes.

21. An apparatus according to claim 20, wherein said pair of spaced-apart electrodes have unequal surface areas.

22. An apparatus for treating a workpiece by a plasma formed from a gas, said apparatus comprising plasma forming means for forming a plasma from said gas, a process chamber for receiving a workpiece to be treated by said plasma, said process chamber arranged in fluid communication with said plasma forming means for receiving said plasma, and generating means for generating ultraviolet light, said generating means arranged for directing said ultraviolet light into a portion of said plasma forming means, whereby said ultraviolet light ignites said plasma therein.

23. An apparatus according to claim 22, wherein said process chamber includes a pair of spaced-apart electrodes of unequal surface area, the distance between said electrodes being substantially constant.

24. An apparatus according to claim 23, wherein one of said electrodes includes a curved peripheral portion having a radius of curvature corresponding to the constant distance between said electrodes.

25. An apparatus according to claim 22, wherein said plasma forming means includes a resonant cavity and transporting means extending through said resonant cavity for transporting a gas therethrough from a source thereof, and said generating means directing said ultraviolet light into a portion of said transporting means within said resonant cavity.

26. An apparatus for treating a workpiece by a plasma formed from a gas, said apparatus comprising a resonant cavity having a longitudinal axis, transporting means extending through said resonant cavity for transporting a gas therethrough from a source thereof, said transporting means including a linear portion arranged substantially parallel to said longitudinal axis of said resonant cavity, a source of energy coupled to said resonant cavity for generating a plasma from said gas within said transporting means, and a process chamber arranged in fluid communication with said transporting means for receiving a workpiece to be treated by said plasma.

27. An apparatus according to claim 26, wherein said transporting means includes a first displaced portion arranged outside said resonant cavity, whereby a portion of said transporting means exiting said resonant cavity is displaced from a portion of said transporting means entering said process chamber.

28. An apparatus according to claim 27, wherein said transporting means includes a second displaced portion arranged within said resonant cavity.

* * * * *